United States Patent [19]

Kobayashi et al.

[11] Patent Number: 4,914,259
[45] Date of Patent: Apr. 3, 1990

[54] MOLDED CIRCUIT BOARD

[75] Inventors: Kenzo Kobayashi, Ichihara; Hirokazu Shiroishi, Hiratsuka, both of Japan

[73] Assignee: The Furukawa Electric Co., Ltd., Tokyo, Japan

[21] Appl. No.: 311,838

[22] Filed: Feb. 16, 1989

[30] Foreign Application Priority Data

Sep. 8, 1987 [JP] Japan .................. 62-136269

[51] Int. Cl.⁴ .............................. H05K 1/00
[52] U.S. Cl. .................. 174/255; 361/397; 361/403; 361/405; 174/261
[58] Field of Search .............. 174/68.5, 255, 261; 361/397, 401, 403, 405

[56] References Cited

U.S. PATENT DOCUMENTS

| 4,405,971 | 9/1983 | Ohsawa | 361/401 |
| 4,439,815 | 3/1984 | Close et al. | 361/386 |
| 4,584,767 | 4/1986 | Gregory | 174/68.5 X |
| 4,604,799 | 8/1986 | Gurol | 174/68.5 X |
| 4,687,695 | 8/1987 | Hamby | 174/68.5 X |
| 4,688,328 | 8/1987 | Jebens et al. | 29/839 |
| 4,710,419 | 12/1987 | Gregory | 174/68.5 X |
| 4,758,459 | 7/1988 | Mehta | 174/68.5 X |
| 4,811,482 | 3/1989 | Moll | 174/68.5 X |

FOREIGN PATENT DOCUMENTS 60-121791 6/1985 Japan .

Primary Examiner—Morris H. Nimmo
Attorney, Agent, or Firm—Frishauf, Holtz, Goodman & Woodward

[57] ABSTRACT

A molded circuit board formed by molding a resin substrate to one side of a circuit film made by forming a desired circuit pattern to an insulating film in a manner to form an integral body. In the circuit film, there are provided soldering pad regions for mounting surface-mounting parts in a surface of the circuit film opposite the other surface in contact with resin substrate and through-holes at locations of the circuit film where insert-mounting parts are mounted. In the resin substrate, holes for receiving insert-mounting parts are formed in the molding process at the locations corresponding to the through-holes of the circuit film.

8 Claims, 2 Drawing Sheets

MOLDED CIRCUIT BOARD

BACKGROUND OF THE INVENTION

1. Field of the Invention

This invention relates to a molded circuit board made by molding a resin substrate adjacent to one side of a circuit film and integrally with therewith.

2. Description of the Related Art

There is a well-known circuit board which is an integral body of a circuit patterned film with a resin substrate, made by setting a circuit-patterned film in a mold and then, extrusion-forming a resin in the mold. (Japanese Patent Disclosure No. 60-121791). For this type of circuit board, it is possible to arbitrarily select a shape of the resin substrate. Therefore, this circuit board is suitable for making electronic device boxes shaped like a rectangular box having a circuit pattern layer attached to the inside surface thereof.

However, the conventional circuit board such as mentioned above has a disadvantage that since the circuit board is made simply by transferring a circuit pattern (in conductor) on the resin substrate, the circuit board can be fitted with surface-mounting type parts, but it does not allow insert-mounting type parts to be mounted on it. When molded circuit boards are used not as housings but as circuit boards incorporated in electronic equipment, they should preferably be capable of being fitted with insert-mounting type parts as well as surface-mounting type parts.

SUMMARY OF THE INVENTION

This invention was made in order to remove the disadvantage of the prior art and the object of this invention is to provide a molded circuit board capable of being fitted with insert-mounting type parts as well as surface-mounting type parts.

A molded circuit board according to this invention comprises a circuit film having an insulating film and a desired circuit pattern on the insulating film, and a resin substrate integrally molded on one side of the circuit film, the circuit film having bonding pad regions for mounting surface-mounting type parts in a surface thereof, opposite the other surface in contact with the resin substrate, the circuit film having also through-holes at locations thereof where insert-mounting type parts are to be mounted, said resin substrate having formed holes for receiving the leads of insert-mounting type parts at locations thereof corresponding to the through-holes.

The through-holes need not necessarily be contact holes.

DETAILED DESCRIPTION OF THE PREFERRED EMBODIMENTS

With reference to the accompanying drawings, an embodiment of the present invention will be described in detail.

Figure 1:
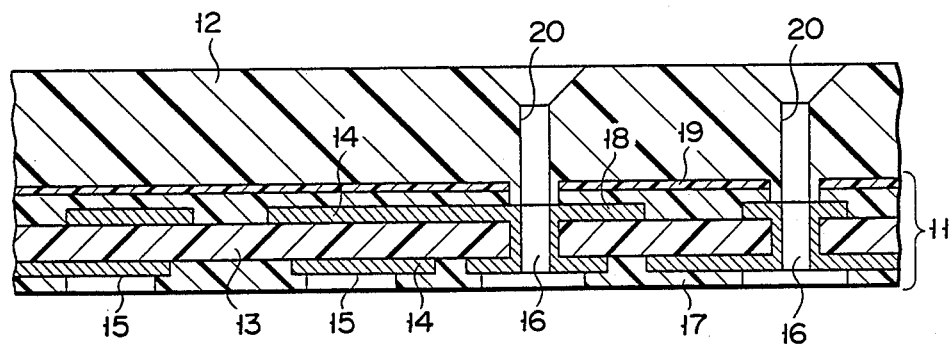
FIG. 1 is a sectional view showing the major components of a molded circuit board according to an embodiment of the present invention.

FIG. 1 shows a molded circuit board according to an embodiment of this invention. A reference numeral 11 indicates a circuit film and 12 indicates a molded resin substrate. Circuit film 11 comprises insulating film 13 and circuit pattern 14 which is formed on both sides of insulating film 13. Insulating film 13 is formed of a resin such as polyimide or polyethylene terephthalate. Circuit pattern 14 is formed by pattern etching of the copper foils put on each side of insulating film. Alternatively, pattern 14 may be formed by printing with a conductive paste. Circuit film 11 has bonding pad regions 15, for mounting surface-mounting parts, which is formed in the surface portion thereof opposite the surface in contact with resin substrate 12. Circuit film 11 also has formed at locations thereof through-holes for mounting insert-mounting parts. The through-holes 16 may sometimes be formed at locations other than those for insert-mounting parts. In brief circuit film 11 is shaped like an ordinary FPC (flexible printed circuit).

Solder resist 17 is printed, other than the regions to be soldered such as bonding pad regions 15, on the surface of circuit film 11 opposite the surface in contact with resin substrate 12. Insulating resist 18 and adhesive 19 are printed on the surface of the side made up of resin substrate 12 of film 11 in such a manner that does not foul through-holes 16.

Resin substrate 12 is formed by resin molding don adjacent to one side of circuit film 11 described above and integrally combined by adhesive 19 with circuit film 11. Formed in resin substrate 12 in the molding thereof are holes 20 for inserting the leads of insert-mounting parts in the locations corresponding to through-holes of circuit film 11. Preferably, the inside diameters of holes 20 are the same as those of through-holes 16 as shown in the drawing or slightly smaller than the inside diameters of through-holes 16 to facilitate the insertion of the leads of insert-mounting parts.

Figure 2:
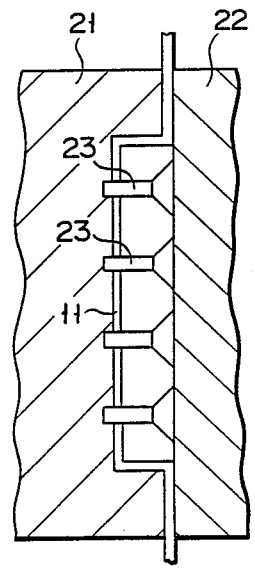
FIG. 2 is a diagram explaining how the circuit board shown in FIG. 1 is manufactured.
Figure 3:
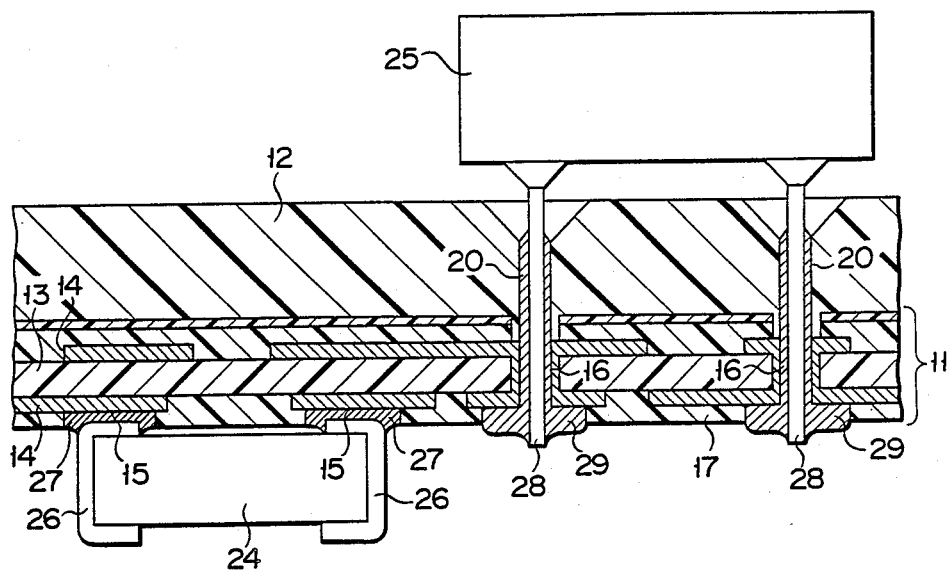
FIG. 3 is a sectional view showing the circuit board and the electronic parts mounted on the board.

A molded circuit board described above is made as shown in FIG. 2. First, circuit film 11 is set in cavity-side mold 21. Next, pins 23 are attached to the inner wall of core-side mold 22, in axial alignment with through-holes 16 of circuit film 11. Then, molding is performed, with pins 23 fitted in the through-holes 16 of circuit film 11.

With reference to Fig, 3, description will be made of the electronic parts mounted on a molded circuit board of FIG. 1. The numeral 24 indicates a surface-mounting part and 25 indicates an insert-mounting part. Surface-mounting part 24 is fixed with solder 2 with terminals 26 located on bonding pads 15. Insert-mounting part 25 with solder 29 with leads 28 inserted through holes 20 and through-holes 16 from resin substrate 12. As described above, a molded circuit board according to this invention can be fitted mixedly with surface-mounting parts and insert-mounting parts.

Figure 4:
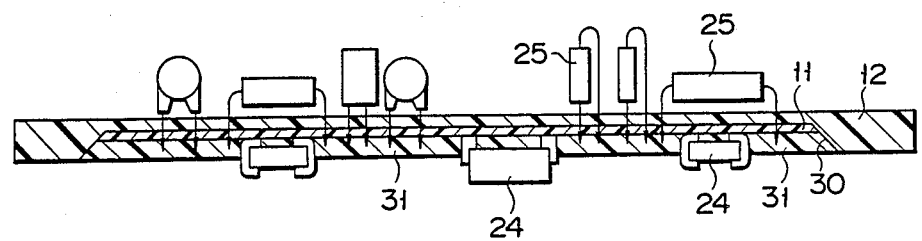
FIG. 4 is a sectional view showing the major components of a molded circuit board according to another embodiment of the invention.

With reference to FIG. 4, another embodiment of the present invention will be described. A molded circuit board of FIG. 4 is made by molding resin substrate 12 adjacent to one side and integrally with circuit film 11 in the same manner as shown in Fig, 1. The difference from the circuit board of FIG. 1 is that depressed area 30 having a bottom which is defined the surface of circuit film 11 is formed in the surface made up of circuit film 11 of resin substrate 12. The reason for providing this depressed area 30 is as follows. When soldering surface-mounting parts 24 and insert-mounting parts 25 to circuit film 11, it is desirable to use a low temperature solder of the lowest possible melting point if the heat resistance of circuit film 11 and resin substrate 12 is taken into account. Low temperature solder is inferior in mechanical strength to 6-4 eutectic solder. For this reason, after surface-mounting parts 24 and insert-mounting parts 25 had been soldered using a low temperature solder, sealing material 31 was filled and solidified in said depressed area 30, thereby reinforcing the insufficient strength of the low temperature solder.

In the above embodiments, the resin substrates were shaped in the form of a flat plate, but it is possible to mold resin substrates in a solid form. It is also possible to form, additionally to and integrally with the resin substrate, portions adapted to be connected with other circuit boards and electronic device housings to thereby improve the assembling efficiency of the resin substrate.

As described above, according to this invention, insert-mounting type parts as well as surface-mounting type parts can be mounted mixedly on a molded circuit board. Furthermore, since the holes of a resin substrate into which the leads of insert-mounting type parts are inserted are formed in molding of the resin substrate, an additional process of boring holes after molding is not required. This makes it possible to provide low-cost circuit boards and increase the applications of molded circuit boards.

What is claimed is:

1. A molded circuit board comprising:
   a circuit film having an insulating film and a desired circuit pattern on said insulating film; and
   a resin substrate integrally molded on one surface of said circuit film,
   said circuit film having bonding pad regions, formed in a surface thereof opposite the surface in contact with resin substrate, for mounting surface-mounting type parts, and through-holes formed at locations thereof where insert-mounting parts are to be mounted,
   said resin substrate having holes, formed at locations thereof corresponding to said through-holes, for receiving the leads of insert-mounting type parts.

2. A molded circuit board according to claim 1, wherein said holes for receiving the leads are holes formed in molding said resin substrate.

3. A molded circuit board according to claim 1, wherein said circuit film has an adhesive layer attached to the surface thereof closer to said resin substrate.

4. A molded circuit board according to claim 3, wherein the insulating film of said circuit film is formed of a resin.

5. A molded circuit board according to claim 4, wherein said insulating film is formed of polyimide or polyethylene terephthalate.

6. A molded circuit board according to claim 1, wherein said circuit film has an insulating layer in the region of the surface thereof other than said bonding pad regions and said through-holes.

7. A molded circuit board according to claim 1, wherein said holes for receiving the leads are formed with an inside diameter equal to or smaller than the inside diameters of said through-holes.

8. A molded circuit board according to claim 1, wherein said resin substrate has a depressed area in the circuit film-formation side thereof, said depressed area being filled with sealing material.

* * * * *

UNITED STATES PATENT AND TRADEMARK OFFICE
CERTIFICATE OF CORRECTION

PATENT NO.  : 4,914,259
DATED       : April 3, 1990
INVENTOR(S) : KOBAYASHI et al It is certified that error appears in the above-identified patent and that said Letters Patent is hereby corrected as shown below:

In the title page, delete the following Foreign Application Priority Data:

Sep. 8, 1987 [JP] Japan......62-136269

Signed and Sealed this

Seventh Day of January, 1992

Attest:

HARRY F. MANBECK, JR.

*Attesting Officer*   Commissioner of Patents and Trademarks